(12) United States Patent
Forstner

(10) Patent No.: US 7,880,477 B2
(45) Date of Patent: Feb. 1, 2011

(54) INTEGRATED CIRCUIT ARRANGEMENT

(75) Inventor: Johann Peter Forstner, Steinhöring (DE)

(73) Assignee: Infineon Technologies AG, Neubiberg (DE)

( * ) Notice: Subject to any disclaimer, the term of this patent is extended or adjusted under 35 U.S.C. 154(b) by 320 days.

(21) Appl. No.: 11/680,869

(22) Filed: Mar. 1, 2007

(65) Prior Publication Data

US 2008/0191710 A1    Aug. 14, 2008

(30) Foreign Application Priority Data

Feb. 14, 2007    (DE) .................. 10 2007 007 357

(51) Int. Cl.
*G01R 29/26*    (2006.01)

(52) U.S. Cl. .................. 324/613; 361/118; 326/26; 716/8

(58) Field of Classification Search .................. 324/613
See application file for complete search history.

(56) References Cited

U.S. PATENT DOCUMENTS

| | | | |
|---|---|---|---|
| 4,857,765 A * | 8/1989 | Cahill et al. .................. 326/26 |
| 5,148,124 A * | 9/1992 | Goff .............................. 331/78 |
| 5,331,217 A * | 7/1994 | Mellissinos .................. 327/100 |
| 6,294,841 B1 * | 9/2001 | Savignac et al. ............ 257/786 |
| 6,532,579 B2 * | 3/2003 | Sato et al. ........................ 716/8 |
| 6,928,242 B1 * | 8/2005 | Demsky et al. ............... 398/23 |
| 7,024,175 B1 * | 4/2006 | Moquin et al. .............. 455/411 |
| 7,193,426 B2 * | 3/2007 | Pochmuller .................. 324/763 |
| 2003/0090306 A1 * | 5/2003 | Saito .......................... 327/164 |
| 2005/0101282 A1 * | 5/2005 | Takikawa et al. ............ 455/333 |
| 2005/0156612 A1 * | 7/2005 | Pochmuller .................. 324/754 |
| 2006/0221531 A1 * | 10/2006 | Nagata ........................ 361/118 |
| 2009/0128134 A1 * | 5/2009 | Takamiya et al. ......... 324/158.1 |

FOREIGN PATENT DOCUMENTS

DE    2349523 A    11/2000
DE    199 28 545 C1    1/2001

OTHER PUBLICATIONS

Kummer, et al., "Fundamental Principles of Microwave Engineering", VEB Verlag Technik Berlin, 1986, pp. 1-5.

* cited by examiner

*Primary Examiner*—Melissa J Koval
*Assistant Examiner*—Benjamin M Baldridge
(74) *Attorney, Agent, or Firm*—Eschweiler & Associates, LLC

(57) ABSTRACT

An integrated circuit arrangement has a signal input 20 and a signal output 60, a signal processing unit 100 which is connected to the signal input 20 and to the signal output 60, a noise source 50 for generating a noise signal, and a noise line 55 which connects the noise source 50 to the signal input 20.

18 Claims, 5 Drawing Sheets

INTEGRATED CIRCUIT ARRANGEMENT

RELATED APPLICATION

This application claims priority from German Patent Application No. DE 10 2007 007 357.9, which was filed on Feb. 14, 2007, and is incorporated herein by reference in its entirety.

TECHNICAL FIELD

Electronic components and chips are tested during production or following production. Automatic test apparatuses (automatic test equipment, ATE) may be used, for example, to subject chips or electronic components to marginal tests, parameter tests or functional tests.

BACKGROUND

In this context, measurements of the noise behavior of integrated circuits are very important since integrated circuits are generally exposed to various noise signals during operation. Therefore, against the background of continually increasing quality demands of consumers, cost-effective test methods which make it possible to characterize the noise behavior of integrated circuits in a simple and accurate manner are desirable.

SUMMARY

According to an embodiment, an integrated circuit arrangement may have a signal input and a signal output, a signal processing unit which is connected to the signal input and to the signal output, a noise source for generating a noise signal, and a noise line which connects the noise source to the signal input.

BRIEF DESCRIPTION OF THE DRAWINGS

Embodiments will be described below with reference to exemplary embodiments which are shown in the appended figures. However, the invention is not restricted to the specifically described exemplary embodiments but rather may be modified and varied in a suitable manner. It is within the scope of the invention to combine individual features and combinations of features of one exemplary embodiment with features and combinations of features of another exemplary embodiment.

DETAILED DESCRIPTION

According to another embodiment, a method for testing an integrated circuit arrangement having a signal processing unit, which is connected to a signal input and to a signal output, a noise source and a first interruption unit, may comprises the following steps:

a) the integrated circuit arrangement is provided and is contact-connected to a measuring device at the signal output;
b) the output signal from the signal processing unit is measured at the signal output with respect to a noise signal having a first noise level; and
c) the output signal from the signal processing unit is measured at the signal output with respect to a noise signal having a second noise level.

According to another embodiment, a method for testing an integrated circuit arrangement having a signal processing unit, which is connected to a signal input and to a signal output, a noise source and a first interruption unit, may comprise the following steps:

a) the integrated circuit arrangement is provided with the interruption unit in a first state in which the signal flow of the noise signal from the noise source to the signal processing unit is allowed, and is contact-connected to a measuring device at the signal output;
b) the output signal from the signal processing unit is measured at the signal output with respect to the noise signal; and
c) after the measurement has been concluded, the first interruption unit is changed to a second state in which the signal flow of the noise signal from the noise source to the signal processing unit is interrupted.

As a result of the use of a noise source which is integrated in the chip of the circuit arrangement, the embodiment has the advantage that it is possible to characterize the noise behavior of the integrated circuit arrangement with a considerably lower degree of complexity.

In order to simplify understanding of the description, identical reference numbers are used below when identical elements which are used together in the figures are involved. Elements in one embodiment may also be used in another embodiment without this being individually mentioned in each case.

Figure 1:
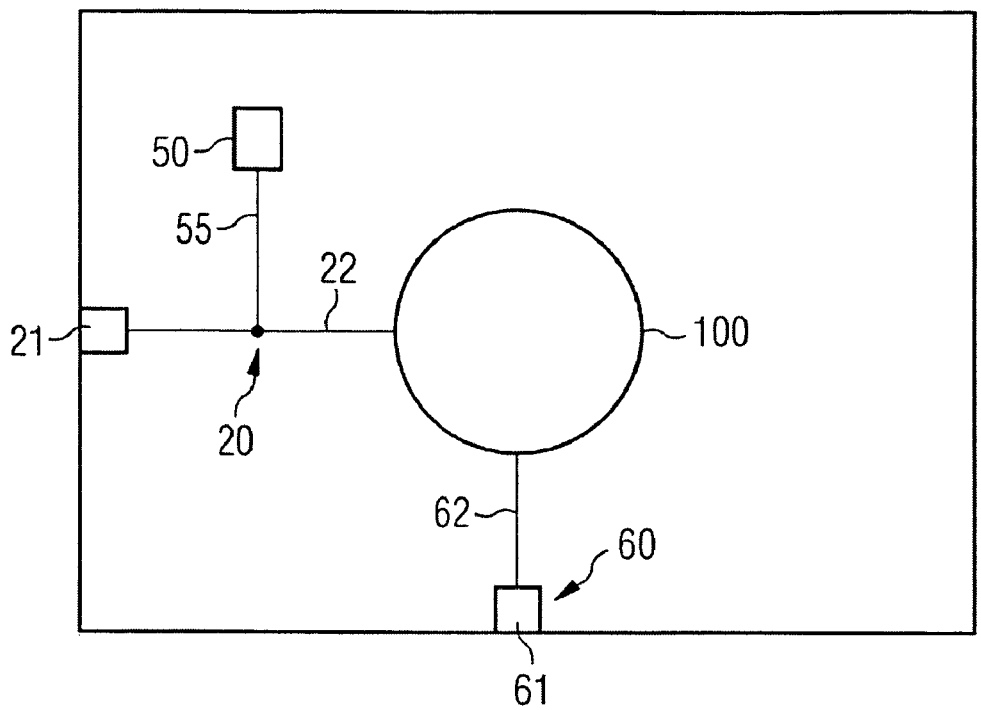
FIG. 1 shows a first embodiment.

FIG. 1 shows a first embodiment. FIG. 1 shows an integrated circuit arrangement having a signal input 20 and a signal output 60 as well as a signal processing unit 100 which is connected to the signal input 20 and to the signal output 60. The integrated circuit arrangement also has a noise source 50 for generating a noise signal, said noise source being connected to the signal input 20 by means of a noise line 55. In this case, the signal input 20 comprises the connection pad 21 and the input signal line 22, and the signal output 60 comprises the connection pad 61 and the output signal line 62.

Hence, the practice of carrying out noise measurements on integrated circuits, for example "Microwave Monolithic Integrated Circuits", so-called MMICs can be performed. In general, noise measurements on integrated circuits, in particular radio-frequency characterization of MMICs, are very costly since the measuring tips used in this case are very expensive and additionally have only a limited service life. It is also difficult to reproduce noise measurements, in particular RF measurements, for example in the mm wavelength range (for example at 77 GHz), since mechanical tolerances may frequently pass into the wavelength range of the test signals.

As a result of the use of a noise source which is integrated in the chip of the circuit arrangement, the embodiment has the advantage that it is possible to characterize the integrated circuit arrangement with a considerably lower degree of complexity. If a noise measurement is carried out using a noise source which is accommodated on the chip to be tested, the measuring tip which was usually used to apply the noise signal to the integrated circuit arrangement from the outside can be omitted.

In this case, the internal noise source serves the same purpose as an external noise source. The reproducibility of the noise source on the chip is very good. In addition, process control measurements (PCM) which take place anyway can be used to predict the characteristics of the noise source in a relatively accurate manner by means of correlation to the PCM measurements.

Figure 2:
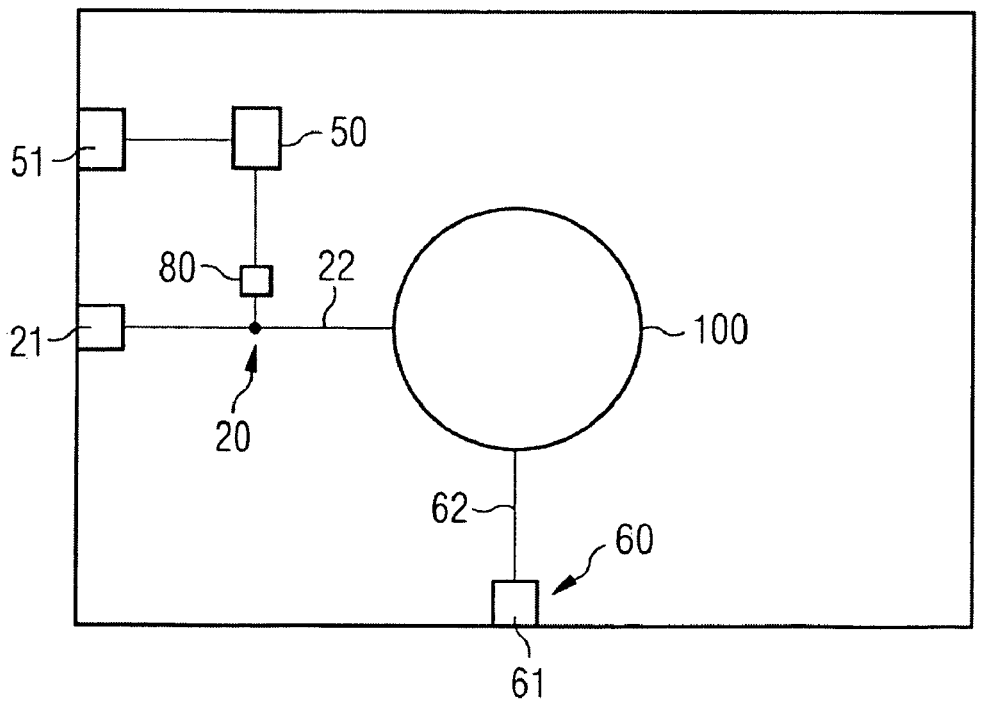
FIG. 2 shows a second embodiment.

FIG. 2 shows a second embodiment. FIG. 2 likewise shows an integrated circuit arrangement having a signal input 20 and a signal output 60 as well as a signal processing unit 100 which is connected to the signal input 20 and to the signal output 60.

The integrated circuit arrangement also has a noise source 50 for generating a noise signal and a first interruption unit 80 which, in a first state, allows the signal flow of the noise signal from the noise source 50 to the signal processing unit 100 and, in a second state, interrupts the signal flow of the noise signal from the noise source 50 to the signal processing unit 100.

The following method for measuring noise can be carried out using the integrated circuit arrangement shown in FIG. 2. In this case, in a first step a), the integrated circuit arrangement is provided with the interruption unit in a first state in which the signal flow of the noise signal from the noise source to the signal processing unit is allowed.

Then, in step b), the output signal from the signal processing unit is measured at the signal output with respect to the noise signal, and, in a step c), after the measurement has been concluded, the first interruption unit is changed to a second state in which the signal flow of the noise signal from the noise source to the signal processing unit is interrupted.

Using the interruption unit makes it possible to isolate the noise source from the signal processing unit after measurement has been carried out, thus largely preventing the integrated noise source from influencing subsequent operation of the signal processing unit. The noise source thus does not interfere with subsequent operation of the signal processing unit.

According to one preferred embodiment, the interruption unit has a switching element, a fuse and/or an antifuse. In this case, it is preferred for the transition between the first and second states of the interruption unit to be able to be implemented by means of an electrical current. Alternatively, the transition between the first and second states of the interruption unit can be implemented by means of a laser beam. Depending on the application, it may be preferred in this case for the first interruption unit to be changed to the second state in an irreversible manner.

If recurrent tests are intended to be allowed during operation of the signal processing unit in a system, it is preferred for the first interruption unit to be changed to the second state in a reversible manner.

The noise source 50 also has a control input 51 which can be used to control the noise source for the purpose of generating at least two different noise levels. Accordingly, the following method for measuring noise can also be carried out using the integrated circuit arrangement shown in FIG. 2. In this case, in a first step: a) the integrated circuit arrangement is provided and is contact-connected to a measuring device at the signal output.

Then, in step b), the output signal from the signal processing unit is measured at the signal output with respect to a noise signal having a first noise level, and, in a step c), the output signal from the signal processing unit is measured at the signal output with respect to a noise signal having a second noise level.

For example, only the noise source 50 is thus activated and the noise power is measured at the output. The noise source 50 is then deactivated (switched off but not yet disconnected) and the noise power is measured again at the output. Finally, after a successful test, the noise source 50 can be disconnected by the interruption unit 80.

According to this preferred embodiment, the measurement is carried out using at least two different noise levels. If, for example, the noise source is connected between two different ENRs via a control input 51, two different noise levels are established at the IF output in the case of a mixer, for example. The noise properties of the signal processing unit 100 can be accurately determined on the basis of said noise levels.

In this case, the integrated noise source 50 behaves, on the input side, like an external calibrated noise source, which is pulsed, and provides two defined and different noise levels (ENRs) when switched on and switched off. On the output side, a so-called "Noise Figure Meter" can then be used to measure the change in the noise level for these two different input noise levels, from which the noise properties of the test object (DUT) can be derived. In the case of radio-frequency measurements, the measurement object need only be contact-connected to an RF measuring tip at a signal input LO in this case.

Figure 3:
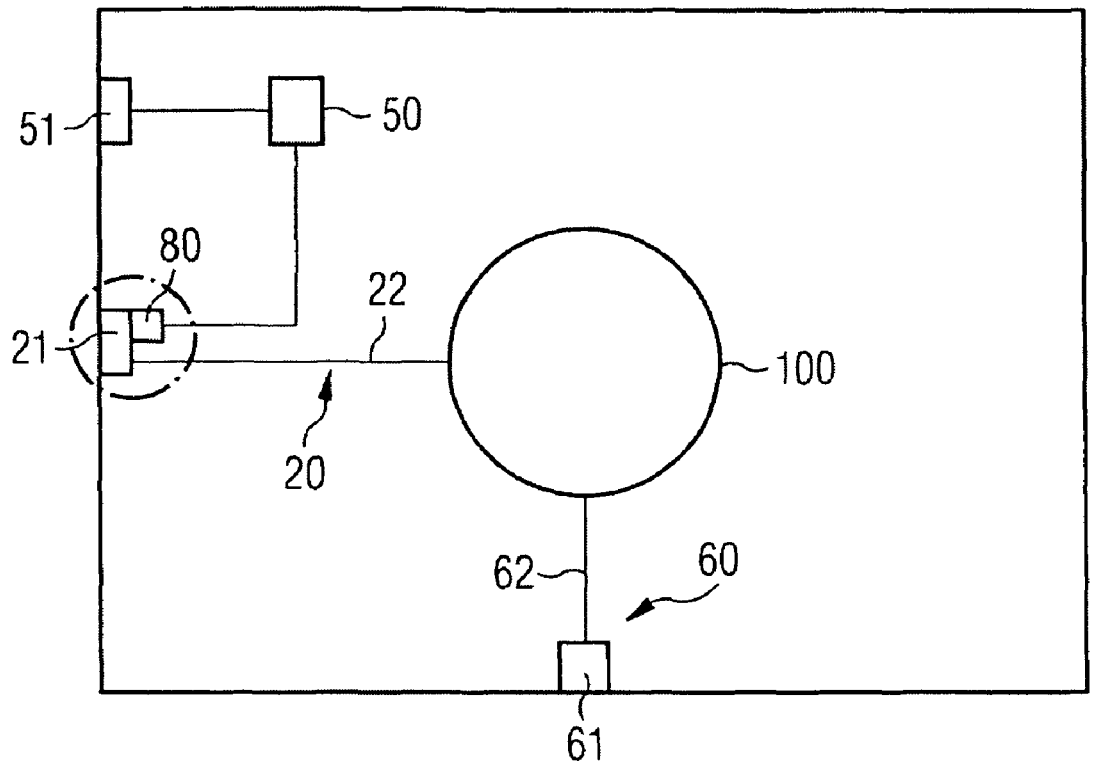
FIG. 3 shows a third embodiment.

FIG. 3 shows a third embodiment. FIG. 3 likewise shows an integrated circuit arrangement having a signal input 20 and a signal output 60 as well as a signal processing unit 100 which is connected to the signal input 20 and to the signal output 60.

The integrated circuit arrangement also has a noise source 50 for generating a noise signal and a first interruption unit 80 which, in a first state, allows the signal flow of the noise signal from the noise source 50 to the signal processing unit 100 and, in a second state, interrupts the signal flow of the noise signal from the noise source 50 to the signal processing unit 100.

In this case, the signal input 20 has a connection pad 21 and an input signal line 22 and the interruption unit 80 is arranged in the immediate vicinity of the connection pad 21. As can be seen from the enlarged view in FIG. 3, the interruption unit 80 according to this embodiment is provided with a desired separation point 81 which is also referred to as a fuse 81. The fuse 81 may be designed in such a manner that the noise line 55 may be easily cut at this point by means of irradiation and/or a flow of current, for instance by providing a locally reduced thickness or width of the line. A laser is preferably used during the separating operation.

Figure 3A:
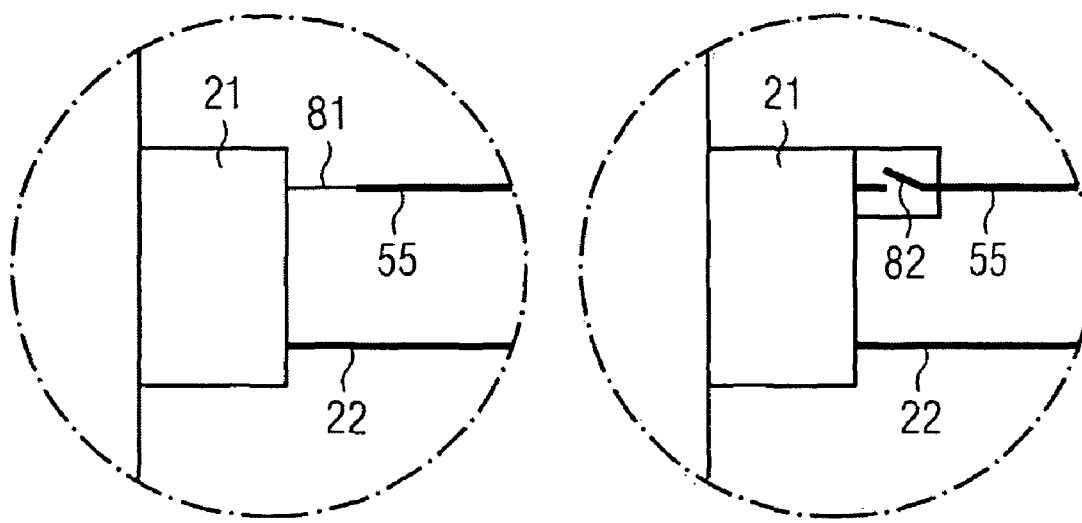

If recurrent tests are intended to be allowed during operation of the signal processing unit in a system, it is preferred for a switching element 82 for the interruption unit 80 to be provided instead of a fuse 81. In this case, the switching element 82 is preferably likewise arranged in the vicinity of the connection pad 21 (FIG. 3a). Contact between the noise source 50 and the signal processing unit 100 can thus now be made/broken in a reversible manner.

Figure 4:
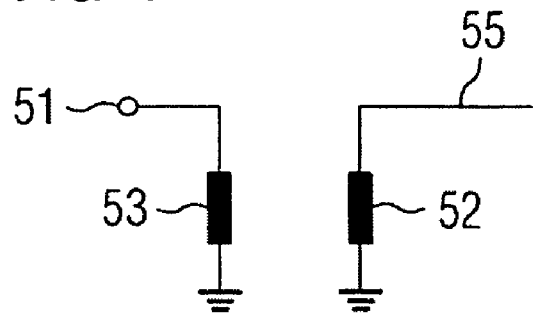
FIG. 4 shows an integrated noise source for use in an integrated circuit arrangement.

FIG. 4 shows the internal structure of one embodiment of an integrated noise source. The noise source has a resistor 52 and a heating unit 53, the temperature of the resistor 52 being able to be set to different values with the aid of the heating unit 53. The resistor 52 is connected to the signal processing unit 100 by means of the noise line 55. Furthermore, the other connection of the resistor 52 can be connected to a fixed potential, for example to the ground potential.

If the resistor 52 is heated by the heating unit 53, a corresponding noise signal is transmitted to the signal processing unit 100 by means of the noise line 55 and the noise behavior of said signal processing unit can be determined.

Figure 5:
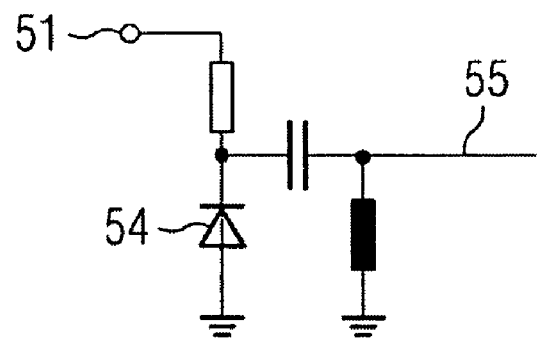
FIG. 5 shows a further integrated noise source for use in an integrated circuit arrangement.

FIG. 5 shows the internal structure of a further embodiment of an integrated noise source 50. In this case, provision is made of an avalanche diode 54 which is connected to the noise line 55 via a capacitor. If a control signal is applied to the control input 51, the avalanche breakdown of the avalanche diode 54 can be used to generate a noise signal on the noise line 55.

Figure 6:
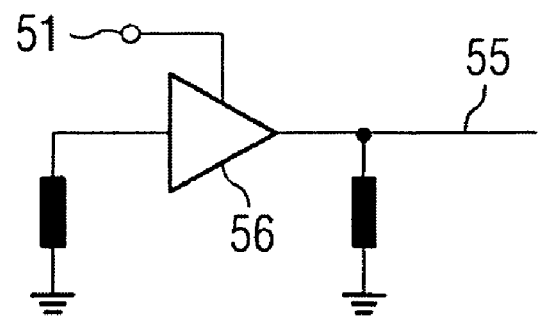
FIG. 6 shows a further integrated noise source for use in an integrated circuit arrangement.

FIG. 6 likewise shows the internal structure of a further embodiment of an integrated noise source 50. In this case, provision is made of an amplifier 56 which amplifies the thermal noise of the resistor 52 and outputs it on the noise line 55. A control signal at the control input 51 can be used to set the gain of the amplifier 56, with the result that different noise levels can be generated.

Figure 7:
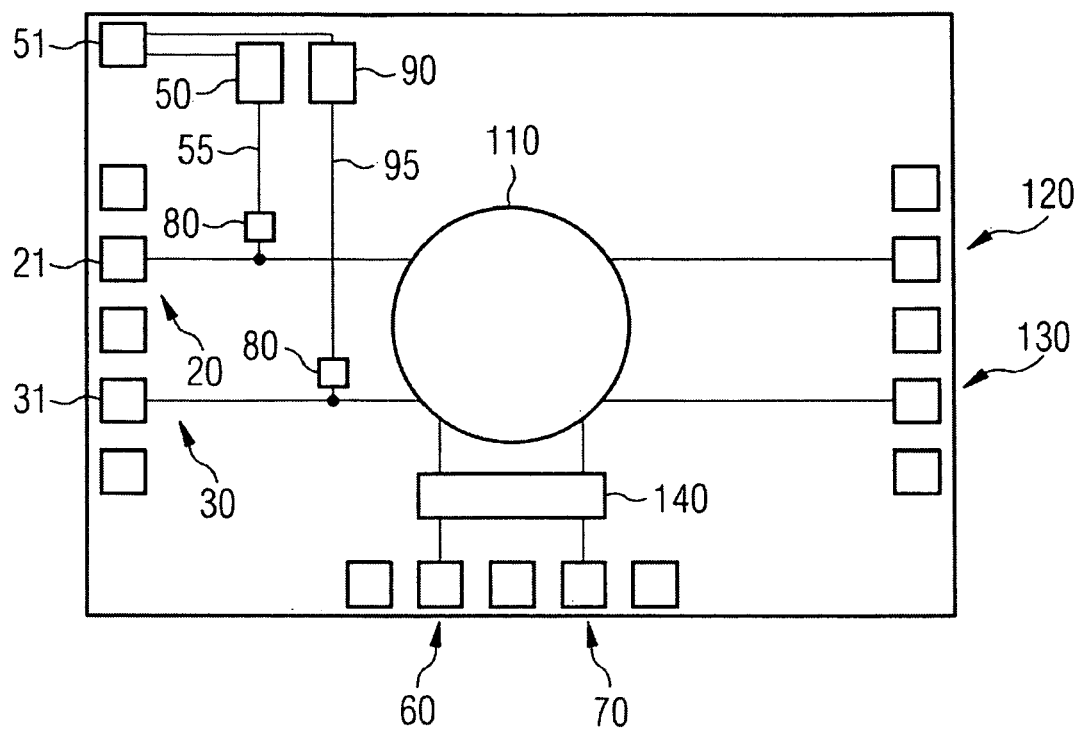
FIG. 7 shows a further embodiment for processing differential input signals.

FIG. 7 shows a further embodiment for processing symmetrical (differential) input signals. In this case, the signal processing unit has a mixer 110 and a filter 140. The mixer 110 reduces the signal RF, which is applied to the signal inputs 20, 30, to an intermediate frequency IF using a signal LO from a local oscillator (not shown), which is applied to the further signal inputs 120, 130, said intermediate frequency being output at the signal outputs 60, 70 by means of the filter 140. If, instead of an input signal, a noise signal is then passed from the noise sources 50, 90 to the mixer 110, the noise behavior of the mixer 110 can be measured.

Figure 8:
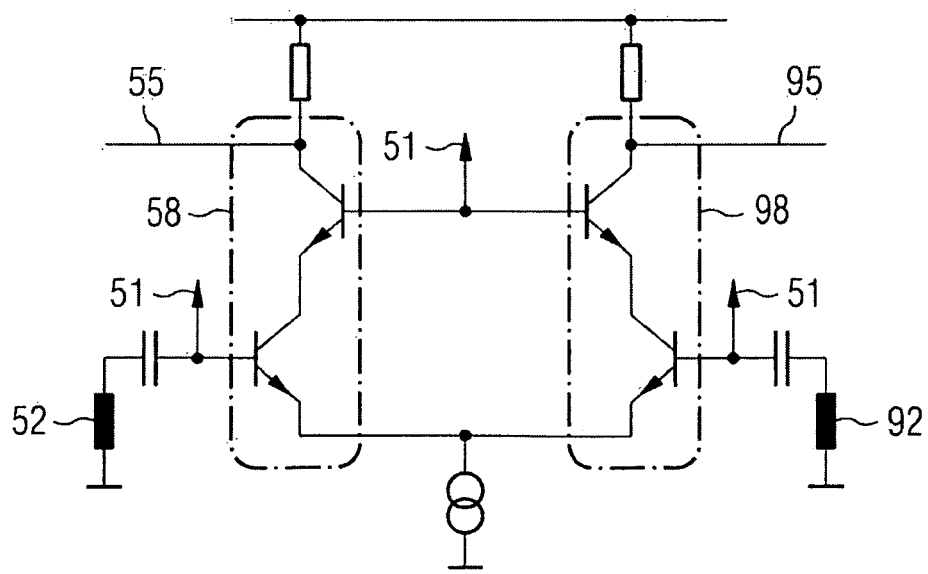
FIG. 8 shows integrated noise sources for use in the integrated circuit arrangement shown in FIG. 7.

In this case, FIG. 8 shows the integrated noise sources 50, 90 for use in the integrated circuit arrangement shown in FIG. 7. The noise sources 50 and 90 each have a resistor 52 and 92. These resistors 52 and 92 are each connected to the noise lines 55 and 95, respectively, via cascode amplifiers 58 and 98. A control signal at the control input 51 can be used to set the gain of the amplifiers 58, 98, with the result that different noise levels can be generated.

Figure 9:
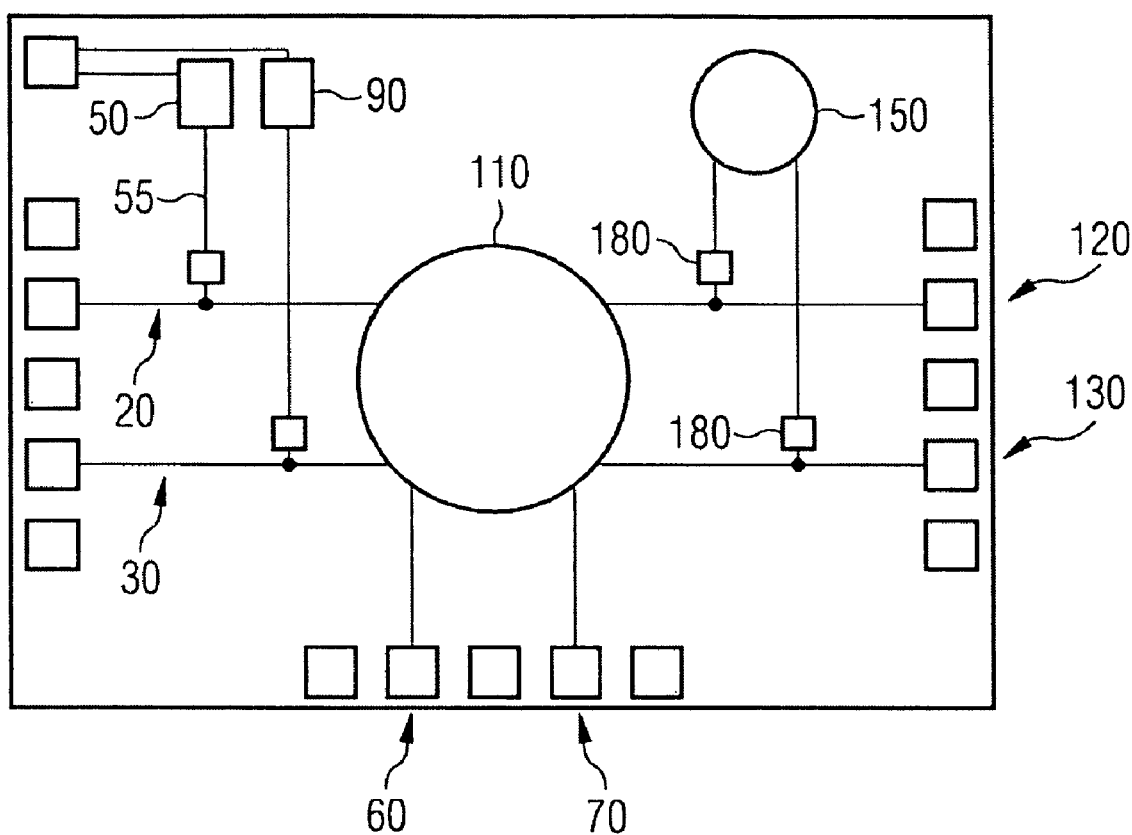
FIG. 9 shows a further embodiment for processing differential input signals.

FIG. 9 shows a further embodiment. In the embodiment shown in FIG. 9, the signal processing unit is again in the form of a mixer and a local signal source 150 which is in the form of a local oscillator is additionally provided. In this case, it is preferred for the signal source 150 to be in the form of a voltage-controlled oscillator (VCO).

The local signal source 150 is connected to the signal processing unit 100 by means of a transmission line 150. Therefore, it is possible to dispense with applying signals to the signal inputs 120, 130 when measuring noise in this embodiment.

The embodiment shown in FIG. 9 additionally has a second interruption unit 180 which, in a first state, allows the signal flow of the signal from the signal source 150 to the signal processing unit 100 and, in a second state, interrupts the signal flow of the signal from the signal source 150 to the signal processing unit 100.

According to one preferred embodiment, the interruption unit has a switching element, a fuse and/or an antifuse. In this case, it is preferred for the transition between the first and second states of the interruption unit to be able to be implemented by means of an electrical current. Alternatively, the transition between the first and second states of the interruption unit can be implemented by means of a laser beam. Depending on the application, it may be preferred in this case for the second interruption unit to be changed to the second state in an irreversible manner.

If recurrent tests are intended to be allowed during operation of the signal processing unit in a system, it is preferred for the second interruption unit to be changed to the second state in a reversible manner.

Using the second interruption unit 180 makes it possible to isolate the signal source 150 from the signal processing unit 100 after measurement has been carried out, thus largely preventing the integrated signal source from influencing subsequent operation of the signal processing unit. The signal source thus does not interfere with subsequent operation of the signal processing unit.

If the embodiment shown in FIG. 9 is operated as a so-called "Direct Conversion" mixer, the contact-connections to RF signals may be completely dispensed with when measuring noise and only LF signals need to be measured at the signal output.

In the case of a 77 GHz direct conversion mixer, as is used in automotive radar front ends, for example, the input-side noise source provides two defined noise levels. The on-chip local oscillator is activated and provides a 77 GHz signal which is used by the mixer to down-convert the RF noise spectrum into a signal around DC at the IF output. After a successful test, the noise source and the local oscillator are disconnected from the mixer by the interruption units and do not impair the actual function of the mixer.

What is claimed is:

1. An integrated circuit arrangement having:
   a signal input and a signal output;
   a signal processing unit which is connected to the signal input and to the signal output, wherein the signal processing unit has a mixer, and at least one of: a filter or a demodulator;
   a noise source for generating a noise signal;
   a noise line which connects the noise source to the signal input wherein the noise source has a control input, and
   a first interruption unit which, in a first state, allows the signal flow of the noise signal to the signal input and, in a second state, interrupts the signal flow of the noise signal to the signal input, wherein the first interruption unit has a switching element, and at least one of: a fuse or an antifuse, and wherein the transition between the first and second states is implemented by an electrical current or by irradiation with a laser;
   wherein the components of the integrated circuit arrangement are integrated on a single integrated circuit chip.

2. The integrated circuit arrangement according to claim 1, wherein the signal input has a connection pad on the single integrated circuit chip and an input signal line, and the interruption unit is integrated on the single integrated circuit chip and is arranged in the immediate vicinity of the connection pad.

3. The integrated circuit arrangement according to claim 1, wherein the noise source has a resistor and/or an avalanche diode.

4. The integrated circuit arrangement according to claim 1, wherein the noise source has a heating unit.

5. The integrated circuit arrangement according to claim 1, wherein the noise source has an amplifier.

6. The integrated circuit arrangement according to claim 1, wherein the circuit arrangement has a signal source which is connected to the signal processing unit by means of a signal line.

7. The integrated circuit arrangement according to claim 6, wherein the signal source is an RF oscillator, in particular a voltage-controlled RF oscillator.

8. The integrated circuit arrangement according to claim 6, comprising a second interruption unit which, in a first state, allows the signal flow to the signal processing unit and, in a second state, interrupts the signal flow to the signal processing unit.

9. The integrated circuit arrangement according to claim 1, wherein the circuit arrangement has at least two signal inputs for receiving a symmetrical input signal, said signal inputs being connected to a respective noise source by means of a respective noise line.

10. A method for testing an integrated circuit arrangement having a signal processing unit, which is connected to a signal input and to a signal output, wherein the signal processing unit has a mixer, and at least one of: a filter or a demodulator; and a noise source; and a signal interruption unit which, in a first state, allows the signal flow of the noise signal to the signal input and, in a second state, interrupts the signal flow of the noise signal to the signal input, wherein the first interruption unit has a switching element, and at least one of: a fuse or an antifuse, and wherein the transition between the first and second states is implemented by an electrical current or by irradiation with a laser, wherein the components of the integrated circuit arrangement are integrated on a single integrated circuit chip, said method having the following steps:
 a) providing the integrated circuit arrangement and contact-connecting the integrated circuit arrangement to a measuring device at the signal output;
 b) measuring the output signal from the signal processing unit at the signal output with respect to a noise signal from the noise source having a first noise level; and
 c) measuring the output signal from the signal processing unit at the signal output with respect to a noise signal having a second noise level that is different than the first noise level.

11. The method according to claim 10, wherein the measurement is carried out while a signal is passed from a signal source of the circuit arrangement to the signal processing unit.

12. The method according to claim 11, wherein a second interruption unit is changed, after the measurement has been concluded, to a second state in which the signal flow from the signal source to the signal processing unit is interrupted.

13. The method according to claim 12, wherein the second interruption unit is changed to a second state in an irreversible manner.

14. The method according to claim 10, wherein the characteristics of the noise source is determined by means of process control measurements during the production process used.

15. A method for testing an integrated circuit arrangement having a signal processing unit, which is connected to a signal input and to a signal output, wherein the signal processing unit has a mixer and at least one of: a filter or a demodulator; a noise source; and a first interruption unit which, in a first state, allows the signal flow of the noise signal to the signal input and, in a second state, interrupts the signal flow of the noise signal to the signal input, wherein the first interruption unit has a switching element, and at least one of: a fuse or an antifuse, and wherein the transition between the first and second states is implemented by an electrical current or by irradiation with a laser, wherein the components of the integrated circuit arrangement are integrated on a single integrated circuit chip, said method having the following steps:
 a) providing the integrated circuit arrangement with the interruption unit in a first state in which the signal flow of the noise signal from the noise source to the signal processing unit is allowed, and the integrated circuit arrangement is contact-connected to a measuring device at the signal output;
 b) measuring the output signal from the signal processing unit at the signal output with respect to the noise signal; and
 c) after the measurement has been concluded, changing the first interruption unit to a second state in which the signal flow of the noise signal from the noise source to the signal processing unit is interrupted;
 wherein the measurement is carried out with at least two different noise levels.

16. The method according to claim 15, wherein the first interruption unit is changed to a second state in an irreversible manner.

17. The method according to claim 15, wherein the first interruption unit is changed to the second state by means of irradiation, in particular with a laser.

18. An integrated circuit arrangement having:
 a signal input and a signal output;
 a signal processing unit which is connected to the signal input and to the signal output, wherein the signal processing unit has a mixer and at least one of: a filter or a demodulator;
 a noise source for generating a noise signal;
 a noise line which connects the noise source to the signal input; and
 a first interruption unit which, in a first state, allows the signal flow of the noise signal to the signal input and, in a second state, interrupts the signal flow of the noise signal to the signal input, wherein the first interruption unit has a switching element, and at least one of: a fuse or an antifuse, and wherein the transition between the first and second states is implemented by an electrical current or by irradiation with a laser,
 wherein the components of the integrated circuit arrangement are integrated on a single integrated circuit chip.

* * * * *